United States Patent
Brask et al.

(10) Patent No.: US 7,407,868 B2
(45) Date of Patent: Aug. 5, 2008

(54) CHEMICAL THINNING OF SILICON BODY OF AN SOI SUBSTRATE

(75) Inventors: Justin K. Brask, Portland, OR (US); Mohamed A. Shaheen, Portland, OR (US); Ruitao Zhang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 182 days.

(21) Appl. No.: 11/073,324

(22) Filed: Mar. 4, 2005

(65) Prior Publication Data

US 2005/0181612 A1 Aug. 18, 2005

Related U.S. Application Data

(63) Continuation of application No. 10/464,016, filed on Jun. 17, 2003, now Pat. No. 6,927,146.

(51) Int. Cl.
 *H01L 21/306* (2006.01)
(52) U.S. Cl. ............... 438/458; 438/459; 438/753
(58) Field of Classification Search ................ 438/753
 See application file for complete search history.

(56) References Cited

U.S. PATENT DOCUMENTS

| 5,462,636 | A | 10/1995 | Chen et al. |
| 5,726,480 | A | 3/1998 | Pister |
| 6,083,849 | A | 7/2000 | Ping et al. |
| 6,189,546 | B1* | 2/2001 | Zhang et al. .......... 134/1.3 |
| 6,277,749 | B1* | 8/2001 | Funabashi ............ 438/689 |
| 6,448,152 | B1 | 9/2002 | Henley et al. |
| 6,653,209 | B1 | 11/2003 | Yamagata |
| 2003/0157809 | A1 | 8/2003 | Geist |

FOREIGN PATENT DOCUMENTS

JP 2001-168308 6/2001

* cited by examiner

*Primary Examiner*—Stephen W Smoot
(74) *Attorney, Agent, or Firm*—George Chen

(57) ABSTRACT

The present invention discloses a method including: providing a silicon wafer; forming a buried oxide (BOX) in the silicon wafer below a silicon body; and reducing a thickness of the silicon body by chemical thinning.

12 Claims, 2 Drawing Sheets

US 7,407,868 B2

CHEMICAL THINNING OF SILICON BODY OF AN SOI SUBSTRATE

This application is a continuation of Ser. No.: 10/464,016, filed on Jun. 17, 2003 and now issued as U.S. Pat. No. 6,927,146 therein.

BACKGROUND OF THE INVENTION

1. Field of the Invention

The present invention relates to the field of semiconductor integrated circuit (IC) manufacturing, and, more specifically, to a method of thinning a silicon body of a silicon-on-insulator (SOI) substrate.

2. Discussion of Related Art

Gordon Moore originally suggested in 1964 that the pace of technology innovation would result in the doubling of the number of transistors per unit area on an IC chip every 12 months. By 1975, the trend had changed to a doubling every 18 months. Over the ensuing decades, the semiconductor industry has adhered closely to Moore's Law in improving the density for every generation of devices. Maintaining such an aggressive schedule has required the scaling down of the transistors in complementary metal oxide semiconductor (CMOS) circuits by using steeper retrograde wells, triple wells, more abrupt source/drain (S/D) junctions, thinner gate dielectric layer, shorter channel length, and more highly-doped channels.

However, doping the channel to a concentration higher than about $10^{18}$ atoms/cm$^3$ degrades carrier mobility and junction characteristics. Tunneling of electrons through the gate dielectric layer also becomes a problem when the thickness of the gate dielectric layer is about 1.5 nanometers (nm) or less. Consequently, beginning with the 90-nm technology node and continuing through the 65-nm technology node, the scaling of planar metal-oxide-semiconductor field effect transistors (MOSFETs) that are fabricated in a bulk silicon substrate has become increasingly hampered by short-channel effects (SCE), such as leakage and threshold voltage, $V_t$, stability.

Thus, even more drastic changes have been required in the device structure and the manufacturing process in order to address SCE. One significant change is substrate enhancement, such as silicon-on-insulator (SOI) technology. An SOI device is a device that is formed in a thin layer of semiconducting material, such as a silicon body, located over a layer of insulating material, such as an oxide, that is embedded in a substrate, such as a silicon wafer.

SOI can lower parasitic capacitance and reduce substrate leakage thereby enabling faster switching speeds and lower-voltage operation. A device built in SOI has a higher drive current, $I_{on}$, and a lower off-state leakage current, $I_{off}$, compared with a device built in bulk silicon. Lowering the threshold voltage allows the thickness of the SOI to be reduced. Reducing the SOI thickness allows much better control over SCE. Threshold voltage, $V_t$, also becomes more consistent for devices with varying channel lengths of 0.6 micron (um) and below.

An SOI device is considered to be partially-depleted when the depletion region in the channel below the gate electrode does not extend completely through the thickness of the silicon body. However, the performance advantage of a partially-depleted SOI device over a bulk-silicon device diminishes when the dimensions are scaled down. A partially-depleted SOI device is also subject to a floating body effect (FBE) which may increase the complexity of the design of the IC.

An SOI device is considered to be fully-depleted when the depletion region in the channel below the gate electrode extends all the way through the thickness of the silicon body. A device built in SOI will be fully-depleted across a range of operating conditions when the thickness of the silicon body is about 40 nm or less. A fully-depleted SOI device has a shorter channel length and displays a more ideal transistor function, such as very sharp turn-on characteristics.

A chemical-mechanical polish (CMP) process may be used to reduce the thickness of the silicon body for an SOI device. However, the thickness of the silicon body may become very non-uniform due to fluctuations in polish pressure or slurry distribution, especially when the SOI device is fabricated in a large substrate, such as a 300-millimeter diameter wafer.

A process alternating between oxidation and etch may be used to reduce the thickness of the silicon body for an SOI device. However, many cycles are required to remove a large amount of silicon.

Thus, what is needed is a method of thinning a silicon body of an SOI substrate.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Figure 1:
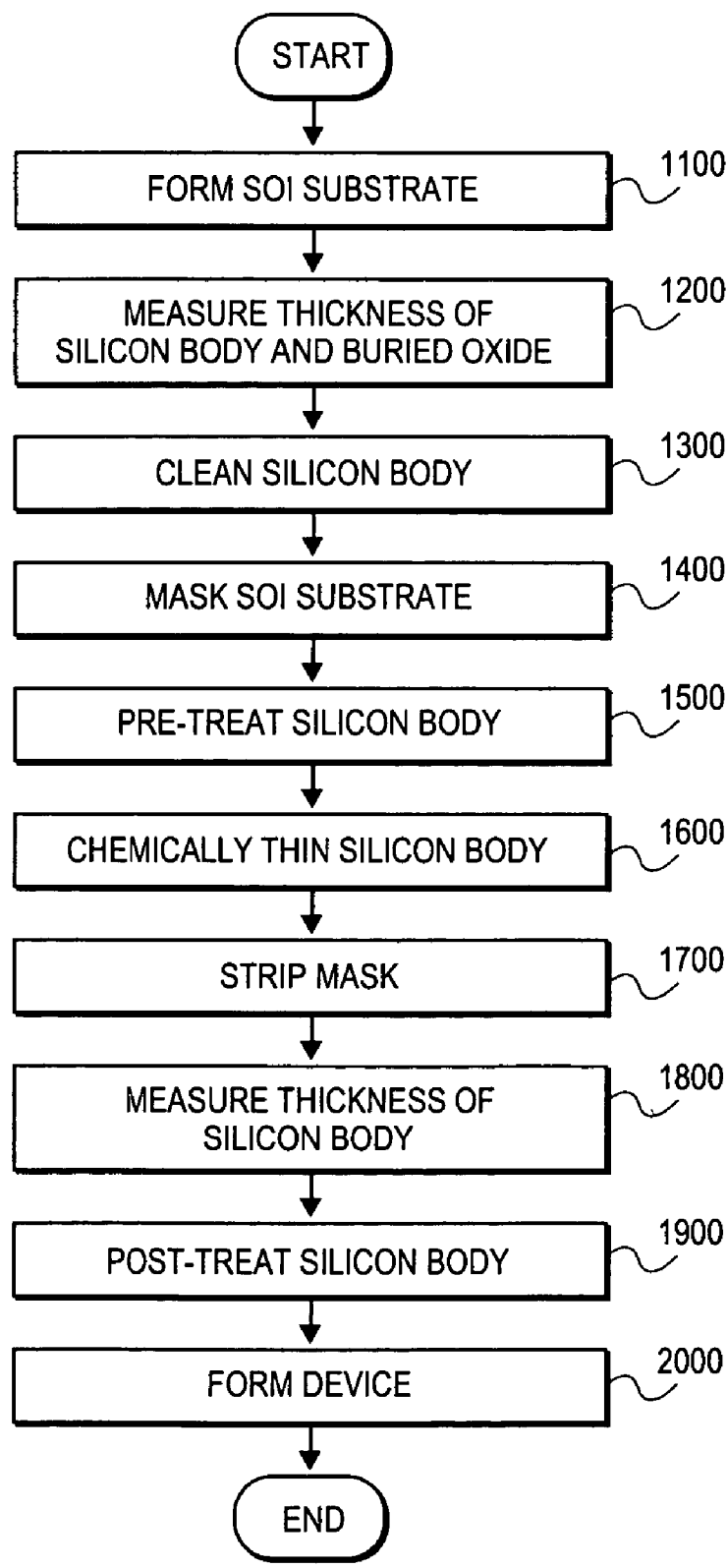
FIG. 1 is an illustration of a flow-chart of an embodiment of a method of thinning a silicon body of an SOI substrate according to the present invention.

The present invention describes various embodiments of a method of thinning a silicon body of a silicon-on-insulator (SOI) substrate, as shown in FIG. 1. The SOI substrate may be formed in step 1100 by various processes, such as an oxygen implantation process or a layer transfer process.

Figure 2A:
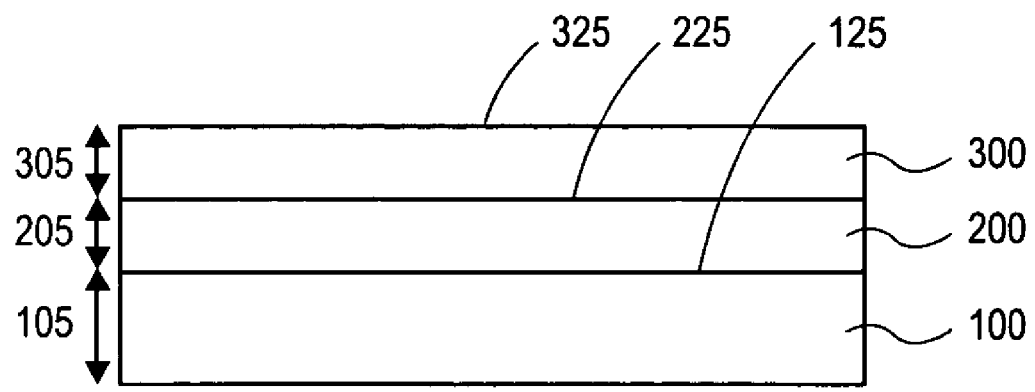
FIG. 2A is an illustration of a cross-sectional view of an embodiment of a silicon body of an SOI substrate before chemical thinning according to the present invention.

In a first embodiment of the present invention, an oxygen implantation process, such as a Separation by IMplantation of Oxygen (SIMOX) process from Ibis Technology Corporation (Danvers, Mass., USA), may be used to form the SOI substrate 50, as shown in FIG. 2A. In the SIMOX process, a high dose of about $0.1\text{-}2.0\times10^{18}$ ions/cm$^2$ of oxygen is implanted at a high energy of about 200 keV into a substrate, such as a silicon wafer, that is held at a raised temperature of about 400-600 degrees Centigrade. Then, the silicon wafer is subjected to an anneal at a high temperature of about 1,300 degrees Centigrade for about 2-6 hours. The result, as shown in an embodiment of the present invention in FIG. 2A, is an SOI substrate 50 that includes a buried oxide (BOX) 200 below a silicon body 300.

In a second embodiment of the present invention, a layer transfer process, such as a process from SOITEC (Bernin, France), may be used to form the SOI substrate 50, as shown in FIG. 2A. In the SOITEC process, an oxide 200 is first grown thermally on a first silicon wafer or seed wafer, resulting in an oxide-silicon interface 225. Next, a high dose of about $5\times10^{16}$ ions/cm² of hydrogen is implanted to form a release interface 325 in the seed wafer below the oxide 200. Then, the oxide 200 on the seed wafer is chemically bonded to a surface 125 of a second silicon wafer or handle wafer 100 to form a buried oxide 200 that is embedded between the seed wafer and the handle wafer 100. After activating the hydrogen thermally at about 500 degrees Centigrade to form voids in the release interface 325, a portion of the seed wafer that is located below the release interface 325 is removed, or cleaved off, and recycled, leaving behind a silicon body 300 attached to the buried oxide 200. Then, the SOI substrate 50 is subjected to an anneal at a moderate temperature of about 1,100 degrees Centigrade. Finally, a chemical-mechanical polish (CMP) process is performed to smooth the surface 325 of the silicon body 300. The result, as shown in an embodiment of the present invention in FIG. 2A, is an SOI substrate 50 that includes a BOX 200 below a silicon body 300.

In a third embodiment of the present invention, a layer transfer process, such as a process from Silicon Genesis, or SiGen, (San Jose, Calif., USA), may be used to form the SOI substrate 50, as shown in FIG. 2A. In the SiGen process, an oxide 200 is first grown thermally on a first silicon wafer or seed wafer, resulting in an oxide-silicon interface 225. Next, a plasma immersion ion implantation (PIII) process may be used to form a release interface 325, such as a hydrogen cleave layer, below the oxide 200 in the seed wafer. Then, a low-power plasma process is used at room temperature to chemically bond the oxide 200 on the seed wafer to a surface 125 of a second silicon wafer or handle wafer 100, such that the oxide 200 is embedded between the seed wafer and the handle wafer 100. Next, a pressurized air burst, such as at room temperature, is used to initiate a crack in the release interface 325. The crack subsequently propagates to remove, or cleave off, a portion of the seed wafer to be recycled, leaving behind a silicon body 300 attached to the oxide 200. Finally, a chemical vapor etch is performed to finish the release interface 325 of the silicon body 300. The result, as shown in an embodiment of the present invention in FIG. 2A, is an SOI substrate 50 that includes a BOX 200 below a silicon body 300.

In a fourth embodiment of the present invention, a layer transfer process, such as a process from Canon Inc. (Hiratsuka, Japan), may be used to form the SOI substrate 50, as shown in FIG. 2A. In the Canon process, a sacrificial interface 325, such as a porous silicon layer, is first formed over a first silicon wafer or seed wafer. Next, an epitaxial silicon layer 300 is formed over the sacrificial interface 325.

The epitaxial deposition may take place in a batch-type reactor or a single wafer reactor. The epitaxial silicon layer 300 may be formed by various processes, such as liquid-phase epitaxy (LPE), ultra-high-vacuum chemical vapor deposition (UHVCVD), vapor-phase epitaxy (VPE), or metal-organic vapor-phase epitaxy (MOVPE). Depending on the type of process used, the epitaxial silicon layer 300 may be formed at a temperature, such as selected from a range of about 600-1200 degrees Centigrade.

In an embodiment of the present invention, the epitaxial silicon layer 300 is grown in a chamber of a reactor at a moderate to high temperature, such as selected from a range of about 900-1200 degrees Centigrade. The source may include silane ($SiH_4$); a higher-order silane, such as disilane ($Si_2H_6$); or a substituted silane, such as dichlorosilane ($SiH_2Cl_2$), trichlorosilane ($SiHCl_3$), or tetrachlorosilane ($SiCl_4$).

Next, an oxide 200 is grown thermally on the epitaxial silicon layer 300, resulting in an oxide-silicon interface 225. Then the oxide 200 on the seed wafer is chemically bonded to a surface 125 of a second silicon wafer or handle wafer 100, such that the oxide 200 is embedded between the seed wafer and the handle wafer 100. A water-jet technique is used to split at the sacrificial interface 325 to detach the seed wafer for recycling. A remaining portion of the sacrificial interface 325 is selectively etched off, leaving behind the epitaxial silicon layer 300 attached to the oxide 200. Finally, the SOI substrate 50 is subjected to an anneal in an atmosphere that includes hydrogen to reduce a roughness of the sacrificial interface 325 of the epitaxial silicon layer 300. The result, as shown in an embodiment of the present invention in FIG. 2A, is an SOI substrate 50 that includes a BOX 200 below a silicon body 300.

After the SOI substrate 50 is formed, the thickness 305 of the silicon body 300 of the SOI substrate 50, as shown in an embodiment of the present invention in FIG. 2A, may be determined, as needed, in step 1200, as shown in an embodiment of the present invention in FIG. 1. The thickness 205 of the BOX 200 of the SOI substrate 50, as shown in an embodiment of the present invention in FIG. 2A, may also be determined, as needed, in step 1200, as shown in an embodiment of the present invention in FIG. 1.

In a first embodiment of the present invention, the silicon body 300, as shown in FIG. 2A, has a thickness 305 of about 250 nanometers (nm) or less. In a second embodiment of the present invention, the silicon body 300 has a thickness 305 of about 100 nm or less. In a third embodiment of the present invention, the silicon body 300 has a thickness 305 of about 40 nm or less.

In a first embodiment of the present invention, the BOX 200, as shown in FIG. 2A, has a thickness 205 of about 200 nm or less. In a second embodiment of the present invention, the BOX 200 has a thickness 205 of about 80 nm or less. In a third embodiment of the present invention, the BOX 200 has a thickness 205 of about 30 nm or less.

The BOX 200 is, in turn, attached to the silicon wafer 100. In a first embodiment of the present invention, the silicon wafer 100, as shown in FIG. 2A, has a thickness 105 selected from a range of about 650-800 microns (um). In a second embodiment of the present invention, the silicon wafer 100 has a thickness 105 selected from a range of about 350-550 um. The thickness 105 may depend on the size, such as the diameter, of the silicon wafer 100.

After the thickness 305 of the silicon body 300 has been measured, the surface 325 of the silicon body 300 may be cleaned, as needed, as shown in step 1300 in an embodiment of the present invention in FIG. 1.

As shown in an embodiment of the present invention in FIG. 2A, after cleaning in step 1300, as needed, the silicon body 300 attached to the BOX 200 may be chemically thinned in step 1600, as needed, such that a fully-depleted device may be subsequently formed in the silicon body 300. As shown in an embodiment of the present invention in FIG. 2B, chemical thinning may reduce the silicon body 300 from a first thickness 305 to a second thickness 306.

Chemically thinning according to the present invention permits a decoupling of the thickness 305 of the silicon body 300 from the thickness 205 of the buried oxide 200. As a result, the process for forming the SOI substrate 50 may be simplified. The yield for forming the SOI substrate 50 may also be improved. In particular, the range, delta range, and straggle of an ion implantation tend to be related so chemical thinning may introduce flexibility to a SIMOX process for forming an SOI substrate 50.

Chemical thinning also permits recovery and use of an SOI substrate 50 that may have a desired thickness 205 of the buried oxide 200, but has an excessively large thickness 305 of the silicon body 300.

Furthermore, chemical thinning permits significantly fewer different part numbers of the SOI substrate 50 to be processed and kept in inventory since the desired thickness 305 of the silicon body 300 may be customized, as needed, by chemical thinning. The thickness 305 of the silicon body 300 that is needed to produce a fully-depleted device depends on the doping levels in the silicon body 300 and the operating conditions of the device.

In some embodiments of the present invention, as shown in step 1400 of FIG. 1, masking materials may be used, as needed, to protect the back surface and the edges of the silicon wafer 100 during chemical thinning. Masking materials may also be used, as desired, to selectively protect certain portions of the surface 325 of the silicon body 300 during chemical thinning. Masking materials may be inorganic, such as an oxide or a nitride, or organic, such as a photoresist or a polyimide. Masking materials may be removed after the chemical thinning is completed.

In certain embodiments of the present invention, etch stop layers may be used in connection with the chemical thinning of the present invention. In an embodiment of the present invention, an etch stop layer may be formed with a different material, such as a silicon oxide or a silicon nitride. In another embodiment of the present invention, a buried etch stop layer may be formed by ion implantation below a release interface 325 of the silicon body 300. In still another embodiment of the present invention, implantation of a dopant, such as boron, carbon, germanium, or nitrogen, at a concentration of about $10^{20}$-$10^{22}$ ions/cm$^3$ will reduce the etch rate of the silicon body 300 by a factor of about 10:1.

Next, the silicon body 300 may be pre-treated, as needed, as shown in step 1500 of FIG. 1. In some embodiments of the present invention, pretreatment may be performed in situ, such as by combining step 1500 and step 1600.

In an embodiment of the present invention, a gas-phase or liquid-phase pretreatment, with or without heating, may be performed in step 1500 prior to chemical thinning in step 1600. In another embodiment of the present invention, a dilute hydrofluoric acid, DHF, may be used, such as for about 60 seconds, to remove native oxide at a surface 325 of the silicon body 300 prior to chemical thinning.

The silicon body 300 may then be etched or chemically thinned, as shown in step 1600 of FIG. 1. In an embodiment of the present invention, a bulk subtractive process may be used for chemical thinning of the silicon body 300 in step 1600 of FIG. 1.

The etchant selected for chemical thinning in step 1600 of FIG. 1 should be compatible with CMOS devices, materials, and processes. Factors to be considered in selecting and using the etchant include volatility, bath life, toxicity, safety, ease of recycling or disposal, and cost.

In an embodiment of the present invention, a desired amount of silicon may be removed by chemical thinning predominantly in a liquid phase, such as by immersion or spray. The apparatus for chemical thinning may include a heater (or chiller), a stirrer (or bubbler), and, as needed, a reflux condenser.

Important parameters of the chemical thinning may include etch rate of the silicon, degree of anisotropy with respect to crystal planes, etch selectivity of silicon (or semiconductor) to silicon oxide (or insulator), surface roughness, and formation of defects, such as pyramidal-shaped hillocks or micro-voids.

In an embodiment of the present invention, the etch selectivity of silicon:oxide may be selected from a range of about 35:1 to about 1,000:1. In another embodiment of the present invention, the etch selectivity increases as the temperature decreases. In still another embodiment of the present invention, the etch rate of silicon increases by about 50-200% for every 10 degrees Centigrade increase in temperature.

In an embodiment of the present invention, the etchant for chemical thinning may include an alkaline solution. In another embodiment of the present invention, the etchant may include an alkaline aqueous solution. In still another embodiment of the present invention, the etchant may include an organic alkaline aqueous solution.

In an embodiment of the present invention, the etchant may include a quaternary ammonium hydroxide, $R_4NOH$, in which the substituent R on the nitrogen atom may include one or more types of functional groups, such as hydrogen, alkyl group, or aryl group.

Alkyl groups include methyl, ethyl, propyl, and butyl groups. In an embodiment of the present invention, the etchant includes tetramethyl ammonium hydroxide (TMAH) or $(CH_3)_4NOH$. In another embodiment of the present invention, the etchant includes tetraethyl ammonium hydroxide or $(C_2H_5)_4NOH$.

In an embodiment of the present invention, the etchant may include TMAH, having a concentration such as about 10-40% by weight, in water. In another embodiment of the present invention, the etchant may include about 25 wt. % TMAH that will etch epitaxial silicon, at 25 degrees Centigrade, at a rate of about 7.50 nm/minute and thermal silicon oxide at a rate of about 0.05 nm/minute, resulting in an etch selectivity of about 150:1.

In an embodiment of the present invention, the etchant for chemical thinning may include one or more additives, promoters, or fillers. In one embodiment of the present invention, the additive may change the etch rate in one or more crystal orientations of the silicon. In another embodiment of the present invention, the additive may change the surface roughness. In still another embodiment, the additive may change the stability or reproducibility of the etch.

In a first embodiment of the present invention, the additive may include a surface-active agent, such as a surfactant. The surfactant may be anionic, cationic, or neutral. The surfactant may be inorganic or organic. The surfactant may change surface tension or wetting at a surface 325 of the silicon body 300.

In a second embodiment of the present invention, the additive may include a liquid or a solvent, that is miscible with the etchant for chemical thinning. The liquid or solvent, such as glycerine, may change the density of the etchant. The liquid or solvent, such as methanol or isopropyl alcohol (IPA), may change the polarity of the etchant.

In a third embodiment of the present invention, the additive may include an oxidizing agent, such as a peroxide or a persulfate. Alternatively, the additive may include a reducing agent.

In a fourth embodiment of the present invention, the additive may include particles of a material, such as silicon or silica.

In a fifth embodiment of the present invention, the additive may include a silicate.

In a sixth embodiment of the present invention, the additive may include an acid, such as silicic acid. The acid may change the pH of the etchant.

In a seventh embodiment of the present invention, the additive may include an amine substituted with hydrogen and/or organic moieties, such as alkyl or aryl groups. An example of a substituted amine is trimethylamine (TMA) or $(CH_3)_3N$.

In an eighth embodiment of the present invention, the additive may include a gas, such as nitrogen, hydrogen, carbon dioxide, or ammonia. The gas may include nitrogen oxide, such as $N_2O$ or $NO_x$. The gas may be bubbled through the etchant to stir the etchant. The gas may be partially or completely mixed or dissolved in the etchant to buffer the etchant.

Figure 2B:
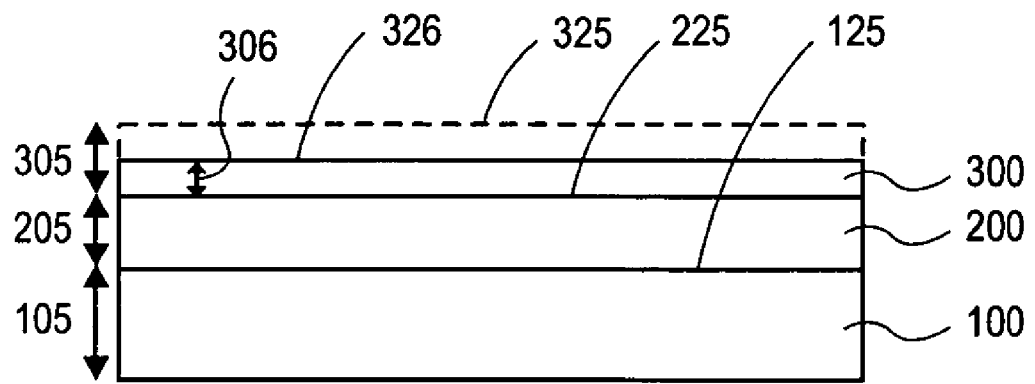
FIG. 2B is an illustration of a cross-sectional view of an embodiment of a silicon body of an SOI substrate after chemical thinning according to the present invention.

As shown in an embodiment of the present invention in FIG. 2B, chemical thinning may be performed on the silicon body 300 to produce a mean thickness 306 that is compatible with a fully-depleted SOI device after subsequent processing. In a first embodiment of the present invention, the silicon body 300 has a mean thickness 306, after chemical thinning, of about 50 nm or less. In a second embodiment of the present invention, the silicon body layer 300 has a mean thickness 306, after chemical thinning, of about 20 nm or less. In a third embodiment of the present invention, the silicon body layer 300 has a mean thickness 306, after chemical thinning, of about 10 nm or less.

Chemical thinning may be performed on the silicon body 300 to produce a thickness 306 non-uniformity that is compatible with a fully-depleted SOI device after subsequent processing. In a first embodiment of the present invention, the silicon body 300 has a thickness 306 non-uniformity, after chemical thinning, of about 5.0% or less (3-sigma). In a second embodiment of the present invention, the silicon body 300 has a thickness 306 non-uniformity, after chemical thinning, of about 2.0% or less (3-sigma). In a third embodiment of the present invention, the silicon body 300 has a thickness 306 non-uniformity, after chemical thinning, of about 7.5% or less (total range). In a fourth embodiment of the present invention, the silicon body 300 has a thickness 306 non-uniformity, after chemical thinning, of about 3.0% or less (total range).

Chemical thinning may be performed on the silicon body 300 to produce a surface 326 roughness that is compatible with a fully-depleted SOI device after subsequent processing. In a first embodiment of the present invention, the silicon body 300 has a surface 326 roughness, after chemical thinning, of about 2.5% or less of the mean thickness. In a second embodiment of the present invention, the silicon body 300 has a surface 326 roughness, after chemical thinning, of about 1.0% or less of the mean thickness. In a third embodiment of the present invention, the silicon body 300 has a surface 326 roughness, after chemical thinning, of about 0.5 nm or less. In a fourth embodiment of the present invention, the silicon body 300 has a surface 326 roughness, after chemical thinning, of about 0.2 nm or less.

After chemical thinning to achieve desired values of mean thickness 306, thickness 306 non-uniformity, and surface 326 roughness, any mask that has been used may be stripped, as needed, as shown in step 1700 of FIG. 1.

Then, the thickness of the silicon body 300, after chemical thinning, may be measured, as needed, in step 1800 of FIG. 1.

The surface 326 of the silicon body layer 300 may be post-treated, as needed, as shown in step 1900 of FIG. 1. In an embodiment of the present invention, the silicon body 300 may be cleaned, as needed, in step 1900 of FIG. 1.

The present invention also claims the structure of an SOI substrate 50, after chemical thinning, as shown in an embodiment in FIG. 2B, having the various values of mean thickness 306, thickness 306 non-uniformity, and surface 326 roughness, as described previously in the formation of the SOI substrate 50.

Then, a device may be formed in the silicon body 300 of the SOI substrate 50, as shown in an embodiment of the present invention in FIG. 2B. The device may be formed in step 2000 in FIG. 1 by using various processes, including the embodiments of the present invention which are described next.

First, a pad oxide layer is grown thermally at one or more temperatures selected from a range of about 850-1,150 degrees Centigrade. The oxidizing agent may include $O_2$ (dry), $H_2O$ (wet), or $H_2/O_2$ (pyrogenic).

In an embodiment of the present invention, the pad oxide layer may be formed with a high pressure oxidation (HiPOX) process. Oxidation at a high pressure may allow the use of a lower oxidation temperature and a shorter oxidation time.

In another embodiment of the present invention, the pad oxide layer may be formed with a rapid thermal oxidation (RTO) process. An RTO process may decrease the thermal budget. In an embodiment of the present invention, the RTO process may include an in situ pyrogenic single wafer process.

In an embodiment of the present invention, the pad oxide layer has a thickness selected from a range of about 3-8 nm. In another embodiment of the present invention, the pad oxide layer has a thickness selected from a range of about 8-30 nm.

Then, an oxidation barrier layer, such as a silicon nitride layer, is formed over the pad oxide layer. The silicon nitride layer may be formed by chemical vapor deposition (CVD) at a temperature selected from a range of about 670-830 degrees Centigrade. In an embodiment of the present invention, the silicon nitride layer may be formed from a reaction of silane and ammonia, such as at atmospheric pressure. In another embodiment of the present invention, the silicon nitride layer may be formed from a reaction of dichlorosilane and ammonia, such as at a sub-atmospheric, or low, pressure.

In an embodiment of the present invention, the silicon nitride layer has a thickness selected from a range of about 25-65 nm. In another embodiment of the present invention, the silicon nitride layer has a thickness selected from a range of about 65-150 nm.

In an embodiment of the present invention, the silicon nitride layer may be used as part of a trench liner, such as for shallow trench isolation (STI). In another embodiment of the present invention, the silicon nitride layer may be used as a polish stop, such as for CMP. In still another embodiment of the present invention, the silicon nitride layer may be used as an etch stop, such as for a reactive ion etch (RIE).

In an embodiment of the present invention, the pad oxide layer serves as a stress buffer layer for the overlying silicon nitride layer. Otherwise, the high tensile stress in the silicon nitride layer may generate severe crystal dislocations in the underlying silicon body 300 during subsequent thermal processing.

The processes of photolithography and etch may be used to pattern the isolation layer on the SOI substrate 50. In an embodiment of the present invention, the isolation layer may include an STI. First, a radiation-sensitive material, such as a photoresist, may be applied or coated over the silicon nitride layer. Next, a reticle for the isolation layer is placed and aligned in the path of radiation of the appropriate wavelength, energy, and dose to determine the portion of the photoresist that is to be exposed. The exposure is performed in an align and expose tool, such as a wafer stepper or a wafer scanner. Exposure is followed by a development of the photoresist, such as in an alkaline aqueous solution, to create a mask on the wafer.

The mask has a feature that corresponds to the exposed portion of the photoresist. The shape and Critical Dimension (CD) of the feature in the photoresist is derived from a design on the isolation-layer reticle. Next, the feature that has been patterned in the photoresist may be transferred into underlying layers.

A plasma process, such as an RIE, may be used to form an opening in the composite stack of silicon nitride layer over pad oxide layer. In one embodiment of the present invention, a high-density plasma, such as a radio frequency (RF) inductively-coupled plasma (ICP), may be used.

The dry etch to form the opening may be performed with a gas mixture that includes an etching gas, such as $CF_4$, and a polymerizing gas, such as $CH_2F_2$. The etching gas serves as the principal source of fluorine for etching while the polymerizing gas improves selectivity by passivating the sidewalls of the opening during the etch. The etch selectivity of the silicon nitride layer and the pad oxide layer relative to the photoresist may be about 20:1 or greater. Other gases that may be used for etching the opening include $C_3F_6$ and $CHF_3$. The etch rate of the silicon nitride layer and the pad oxide layer may be selected from a range of about 30-200 nm per minute.

In an embodiment of the present invention, the photoresist is stripped off and a shallow trench etch is done using the silicon nitride layer as a hard mask. In another embodiment of the present invention, the etch selectivity to photoresist is high enough so the silicon nitride, the pad oxide, and the trench may be etched, consecutively, without first removing the photoresist.

A low-pressure, high-density plasma etch, such as with $Cl_2/Ar$, may be used to etch a trench into the silicon body 300. In another embodiment of the present invention, the etch may be performed with other gases, including mixtures of gases, such as $Cl_2/He$ or $HBr/Cl_2$.

The profile of the sidewall of the trench may be critical. Depending on the trench fill process to be used, the angle of the sidewall of the trench may be selected from a range of about 70-90. In an embodiment of the present invention, the profile may include two or more slopes. In another embodiment of the present invention, the profile of the sidewall of the trench may be slightly rounded, such as at or near the bottom of the trench.

After trench etch, a liner oxide is grown thermally to serve several purposes. First, the liner oxide removes damage that may result from the trench etch. Second, the liner oxide enhances corner rounding at the top of the trench and the bottom of the trench to minimize stress upon oxide fill. Third, the liner oxide controls sub-threshold leakage by preventing gate wraparound. Fourth, the liner oxide provides an interface for depositing the oxide fill.

In an embodiment of the present invention, the liner oxide layer has a thickness selected from a range of about 3-8 nm. In another embodiment of the present invention, the liner oxide layer has a thickness selected from a range of about 8-15 nm. In still another embodiment of the present invention, a liner nitride layer may be formed over the liner oxide layer prior to filling the trench.

Next, the trench may be filled with a dielectric material, such as an oxide, using CVD. The gapfill must be able to fill a shallow trench with a depth:width aspect ratio of 6:1 or greater. The gapfill should not include any void, weak seam, or metallic contamination. Consequently, the trench may have to be overfilled by 20-50% in order to achieve good results. The oxide may be densified by annealing so as to endure subsequent CMP, wet etches, and cleans. In an embodiment of the present invention, annealing the gapfill, such as at a temperature of about 1,000-1,100 degrees Centigrade, may reduce the wet etch rate of the gapfill by about 20%.

The shallow trench isolation is planarized with CMP. The CMP may be performed using a slurry with a high pH, such as about 10.0-11.0, in conjunction with abrasives, such as very fine silica or alumina particles. The high pH will hydroxylate the oxide, but not the nitride. The silica particles will mechanically abrade both oxide and nitride. Planarization of the gapfill occurs because the effective pressure exerted on elevated features is higher than the effective pressure exerted on recessed areas. However, the polish pad is not infinitely stiff so excessive thinning, or dishing, of the gapfill in the middle of wide exposed regions may occur. Dishing is highly pattern-dependent.

In an embodiment of the present invention, the CMP must remove all the gapfill (oxide layer) over the active area without eroding too much of the underlying polish stop (nitride layer). In other words, the gapfill-to-polish stop selectivity must be high enough to minimize dishing of the gapfill (oxide layer) and erosion of the polish stop (nitride layer).

After the formation of the shallow trench isolation, the composite stack is removed. First, buffered hydrofluoric acid, such as 5:1 BHF, may be used to remove a thin layer of oxynitride that may have formed over the silicon nitride layer. Next, the silicon nitride layer is removed with phosphoric acid, such as 85% phosphoric acid, at about 160-180 degrees Centigrade, such as using a reflux boiler. Then, the pad oxide layer is removed with hydrofluoric acid. The result is an isolation region that separates adjacent active regions. In an embodiment of the present invention, part or all of the composite stack may be removed by a dry etch process.

Fully-depleted devices may be located in adjacent active regions of an SOI substrate 50 that are separated by an isolation region formed by an STI process. The upper surface of the isolation region should be relatively level or planar with the upper surface of the active regions. Thus, the structure of the present invention has a dense and planar isolation region.

In an embodiment of the present invention, a fully-depleted device may be formed in each of the active areas in a silicon body 300 as follows:

If desired, a thin layer of sacrificial oxide may be grown over the silicon body 300 in the active regions. A wet etch of the sacrificial oxide will remove any damage in the silicon body 300. Etching off the sacrificial oxide will also remove any silicon oxynitride that may have formed over the silicon body 300 near the edges of the silicon nitride (Kooi effect) during an oxidation. Otherwise, silicon oxynitride may interfere with the subsequent formation of a gate dielectric stack, resulting in thin and nonuniform spots.

Ultra-low energy ion implantation may be used to adjust the threshold voltage, $V_t$.

A gate dielectric stack may be formed over the silicon body 300. The gate dielectric stack may have a physical thickness of about 0.6-1.5 nm. In an embodiment of the present invention, the gate dielectric stack may include an amorphous high-k (greater than about 15)material, such as hafnium oxide ($HfO_2$), formed with metal-organic chemical vapor deposition (MOCVD) or atomic layer deposition (ALD).

A gate electrode may be formed over the gate dielectric stack and patterned by photolithography and etch. The gate electrode has a thickness of about 40-65 nm and may be doped polysilicon, or doped polysilicon covered with metal, or a single metal, or a double metal, such as Tantalum or Titanium for NMOS and Tantalum Nitride, Tungsten Nitride, or Titanium Nitride for PMOS. Unlike a doped polysilicon gate electrode, a metal gate electrode is not subject to a depletion effect. In an embodiment of the present invention, the physical gate length may be about 25-50 nm.

Ultra-low energy ion implantation and spike anneal may be used to form extensions to the source and drain on each side of the gate. Tilted implants may be performed if desired. In an embodiment of the present invention, plasma or gas phase doping may be used. The source and drain extensions may have a junction depth of about 10-20 nm.

A sidewall spacer with a thickness of about 25-80 nm may be formed on both sides of the gate. The sidewall spacer may include one or more layers of dielectric materials.

A raised source and drain may be formed next to the sidewall spacer on both sides of the gate with selective epitaxial deposition. The raised source and drain improves silicide formation and reduces parasitic capacitance.

Ultra-low energy ion implantation and spike anneal may be used to dope the source and drain. In an embodiment of the present invention, plasma or gas phase doping may be used. The raised source and drain may have a junction depth of about 20-40 nm.

Nickel silicide (NiSi) with a thickness of about 15-25 nm may be formed over the raised source and drain and, if the gate electrode includes doped polysilicon, the gate electrode. The nickel silicide reduces contact leakage and consumes less silicon than cobalt silicide ($CoSi_2$).

An interlayer dielectric (ILD) layer may be formed over the device. The ILD may be formed from a low-dielectric constant material, such as organosilicate glass (OSG) or carbon-doped oxide (CDO). The low-k material may have a value selected from a range of 1.0-2.2. The low-k material may be applied by spin-on or deposited by CVD. The ILD may include pores (porous). The ILD may include an air gap. A dual-damascene scheme with CMP may be used to form multilayer interconnects to the device with metal, such as copper, or alloy. As needed, diffusion barrier layers and shunt layers may be included for the vias and metal lines.

The present invention also claims the structure of an SOI substrate 50, after chemical thinning, that includes a device as described in various embodiments previously.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of thinning a silicon body of an SOI substrate.

We claim:

1. A method comprising:
   providing a silicon wafer;
   forming a buried oxide (BOX) in said silicon wafer below a silicon body; and
   reducing a thickness of said silicon body by chemical thinning in an alkaline solution with an additive, said alkaline solution comprising tetramethyl ammonium hydroxide (TMAH), said additive comprising trimethylamine.

2. The method of claim 1 wherein said buried oxide (BOX) comprises a thickness of 30 nanometers or less.

3. The method of claim 1 wherein said silicon body comprises a thickness of 40 nanometers or less before chemical thinning.

4. The method of claim 1 wherein said silicon body comprises a thickness of 10 nanometers or less after chemical thinning.

5. The method of claim 1 wherein said tetramethyl ammonium hydroxide (TMAH) comprises 25 weight % in water.

6. The method of claim 1 wherein said chemical thinning is done at 25 degrees Centigrade.

7. A method comprising:
   providing a seed wafer;
   forming an oxide over said seed wafer;
   forming a release interface in said seed wafer below said oxide;
   bonding said oxide to a handle wafer to form a buried oxide (BOX), said BOX being embedded between said seed wafer and said handle wafer;
   removing a portion of said seed wafer that is disposed below said release interface, leaving behind a silicon body attached to said buried oxide; and
   chemically thinning said silicon body in an alkaline solution with an additive, said alkaline solution comprising tetramethyl ammonium hydroxide (TMAH), said additive comprising trimethylamine.

8. The method of claim 7 wherein said buried oxide (BOX) comprises a thickness of 30 nanometers or less.

9. The method of claim 7 wherein said silicon body comprises a thickness of 40 nanometers before chemical thinning.

10. The method of claim 7 wherein said silicon body comprises a thickness of 10 nanometers after chemical thinning.

11. The method of claim 7 wherein said tetramethyl ammonium hydroxide (TMAH) comprises 25 weight % in water.

12. The method of claim 7 wherein said chemical thinning is done at 25 degrees Centigrade.

* * * * *